United States Patent
Lee et al.

(10) Patent No.: US 10,671,112 B2
(45) Date of Patent: Jun. 2, 2020

(54) GATE DRIVING CIRCUIT AND DISPLAY APPARATUS HAVING THE SAME

(71) Applicant: Samsung Display Co., Ltd., Yongin-si, Gyeonggi-do (KR)

(72) Inventors: Whee-Won Lee, Busan (KR); Ji Young Eom, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/541,904

(22) Filed: Aug. 15, 2019

(65) Prior Publication Data
US 2020/0133327 A1    Apr. 30, 2020

(30) Foreign Application Priority Data
Oct. 24, 2018    (KR) .................. 10-2018-0127668

(51) Int. Cl.
*G06F 1/08* (2006.01)
*G09G 3/20* (2006.01)
*H03C 3/09* (2006.01)

(52) U.S. Cl.
CPC ............ *G06F 1/08* (2013.01); *G09G 3/2092* (2013.01); *H03C 3/0966* (2013.01); *G09G 2310/067* (2013.01)

(58) Field of Classification Search
None
See application file for complete search history.

(56) References Cited

U.S. PATENT DOCUMENTS

| | | | |
|---|---|---|---|
| 7,417,458 B2 * | 8/2008 | Ahn ...................... | G09G 3/3677 326/27 |
| 10,026,373 B2 | 7/2018 | Chen | |
| 2015/0042547 A1 * | 2/2015 | Kwon .................... | G11C 19/28 345/89 |
| 2015/0042689 A1 * | 2/2015 | Kim ....................... | H03K 3/012 345/690 |
| 2015/0077407 A1 * | 3/2015 | Kim ...................... | G09G 3/3611 345/204 |
| 2015/0206490 A1 * | 7/2015 | Lim ...................... | G09G 3/3677 345/92 |
| 2015/0228240 A1 * | 8/2015 | Ahn ..................... | H03K 17/284 345/213 |
| 2015/0380563 A1 * | 12/2015 | Park .................. | H01L 29/78606 257/43 |

(Continued)

*Primary Examiner* — Lincoln D Donovan
*Assistant Examiner* — Khareem E Almo
(74) *Attorney, Agent, or Firm* — Lewis Roca Rothgerber Christie LLP (57) ABSTRACT

A gate driving circuit includes a pull-up control part for applying a first previous carry signal to a first node in response to the first previous carry signal, a first pull-up part outputting a clock signal as an N-th gate output signal in response to a signal applied to the first node, a second pull-up part outputting the clock signal as the N-th gate output signal in response to the signal applied to the first node, a carry part outputting the clock signal as an N-th carry signal in response to the signal applied to the first node, a first pull-down part pulling down the signal at the first node to a second off voltage, and a second pull-down part pulling down the N-th gate output signal to a first off voltage, wherein one of the first pull-up part and the second pull-up part is selectively activated.

20 Claims, 7 Drawing Sheets

(56) References Cited

U.S. PATENT DOCUMENTS

2017/0249893 A1* 8/2017 Kim ................... G09G 3/2092
2017/0287425 A1* 10/2017 Koo ..................... G09G 5/18
2018/0012531 A1* 1/2018 Park ................... G09G 3/2003
2018/0182345 A1* 6/2018 Seong ................ G09G 3/3677
2019/0348007 A1* 11/2019 Lee .................... G09G 3/3648

* cited by examiner

GATE DRIVING CIRCUIT AND DISPLAY APPARATUS HAVING THE SAME

CROSS-REFERENCE TO RELATED APPLICATION

This application claims priority to, and the benefit of, Korean Patent Application No. 10-2018-0127668, filed on Oct. 24, 2018 in the Korean Intellectual Property Office KIPO, the contents of which are herein incorporated by reference in their entireties.

BACKGROUND

1. Field

Embodiments of the present disclosure relate to a gate driving circuit for enhancing reliability, and a display apparatus including the gate driving circuit.

2. Description of the Related Art

Generally, a display apparatus includes a display panel and a display panel driver. The display panel includes a plurality of gate lines and a plurality of data lines. The display panel driver includes a gate driver for outputting gate signals to the gate lines, and a data driver for outputting data voltages to the data lines.

The gate driver may output the gate signals using switching elements integrated on the display panel. When the display apparatus is used for a long time, some of the switching elements may be deteriorated so that a display defect of the display apparatus may be generated.

SUMMARY

Embodiments of the present disclosure provide a gate driving circuit for enhancing a reliability of the gate driving circuit.

Embodiments of the present disclosure also provide a display apparatus including the gate driving circuit.

In an embodiment of a gate driving circuit according to the present disclosure, the gate driving circuit includes a pull-up control part configured to apply a first previous carry signal, which is a carry signal of one of previous stages, to a first node in response to the first previous carry signal, a first pull-up part configured to output a clock signal as an N-th gate output signal in response to a signal applied to the first node, a second pull-up part configured to output the clock signal as the N-th gate output signal in response to the signal applied to the first node, a carry part configured to output the clock signal as an N-th carry signal in response to the signal applied to the first node, a first pull-down part configured to pull down the signal at the first node to a second gate-off voltage in response to a first next carry signal, which is a carry signal of one of next stages, a second pull-down part configured to pull down the N-th gate output signal to a first gate-off voltage in response to the first next carry signal, and an inverting part configured to generate an inverting signal based on the clock signal, and based on the first gate-off voltage or the second gate-off voltage, to output the inverting signal to an inverting node, wherein one of the first pull-up part and the second pull-up part is selectively activated, and wherein N is a positive integer.

The gate driving circuit may include a plurality of stages, wherein a gate output voltage of at least one of the stages is fed back.

The first pull-up part may include a first pull-up transistor including a control electrode coupled to a second node, an input electrode for receiving the clock signal, and an output electrode coupled to a gate output terminal configured to output the N-th gate output signal.

The second pull-up part may include a second pull-up transistor including a control electrode coupled to a third node, an input electrode for receiving the clock signal, and an output electrode coupled to the gate output terminal configured to output the N-th gate output signal.

The gate driving circuit may further include a first selecting transistor including a control electrode for receiving a first selecting signal, an input electrode coupled to the first node, and an output electrode coupled to the second node.

The gate driving circuit may further include a second selecting transistor including a control electrode for receiving a second selecting signal, an input electrode coupled to the first node, and an output electrode coupled to the third node.

The gate driving circuit may further include a carry pull-down part configured to pull down the N-th carry signal to the second gate-off voltage in response to the first next carry signal.

The gate driving circuit may further include a first holding part configured to pull down the N-th gate output signal to the first gate-off voltage in response to the inverting signal.

The gate driving circuit may further include a second holding part configured to pull down the first node to the second gate-off voltage in response to the inverting signal.

The gate driving circuit may further include a third holding part configured to pull down the inverting node to the second gate-off voltage in response to the first previous carry signal.

The gate driving circuit may further include a fourth holding part configured to pull down the first node to the second gate-off voltage in response to a second next carry signal, which is a carry signal of one of the next stages and is different from the first next carry signal.

The gate driving circuit may further include a fifth holding part configured to pull down the N-th carry signal to the second gate-off voltage in response to the inverting signal.

In an embodiment of a display apparatus according to the present disclosure, the display apparatus includes a display panel configured to display an image, a data driving circuit configured to output a data voltage to the display panel, a gate driving circuit configured to output a gate output signal to the display panel, and a gate signal determiner configured to control operation of the gate driving circuit, wherein the gate driving circuit includes a pull-up control part configured to apply a first previous carry signal, which is a carry signal of one of previous stages, to a first node in response to the first previous carry signal, a first pull-up part configured to output a clock signal as an N-th gate output signal in response to a signal applied to the first node, a second pull-up part configured to output the clock signal as the N-th gate output signal in response to the signal applied to the first node, a carry part configured to output the clock signal as an N-th carry signal in response to the signal applied to the first node, a first pull-down part configured to pull down the signal at the first node to a second gate-off voltage in response to a first next carry signal, which is a carry signal of one of next stages, a second pull-down part configured to pull down the N-th gate output signal to a first gate-off voltage in response to the first next carry signal, and an inverting part configured to generate an inverting signal based on the clock signal, and based on the first gate-off voltage or the second gate-off voltage, to output the inverting signal to an inverting node, wherein the gate signal determiner is configured to output a selecting signal, which is for activating one of the first pull-up part and the second pull-up part, to the gate driving circuit, and wherein N is a positive integer.

The display apparatus may further include a power voltage generator configured to output a driving voltage to the gate driving circuit, and including the gate signal determiner.

The display apparatus may further include a driving controller configured to control driving timings of the data driving circuit and the gate driving circuit, and including the gate signal determiner.

The gate driving circuit may include a plurality of stages, wherein a gate output voltage of at least one of the stages is fed back to the gate signal determiner.

The first pull-up part may include a first pull-up transistor including a control electrode coupled to a second node, an input electrode for receiving the clock signal, and an output electrode coupled to a gate output terminal configured to output the N-th gate output signal.

The second pull-up part may include a second pull-up transistor including a control electrode coupled to a third node, an input electrode for receiving the clock signal, and an output electrode coupled to the gate output terminal configured to output the N-th gate output signal.

The gate driving circuit may further include a first selecting transistor including a control electrode for receiving a first selecting signal, an input electrode coupled to the first node, and an output electrode coupled to the second node.

The gate driving circuit may further include a second selecting transistor including a control electrode for receiving a second selecting signal, an input electrode coupled to the first node, and an output electrode coupled to the third node.

According to the gate driving circuit and the display apparatus including the gate driving circuit, when the display apparatus is driven for a long time, a shift of a threshold voltage of a switching element of the gate driving circuit may be reduced or prevented. Accordingly, the display defect in which the gate driving circuit does not output a normal gate signal due to the shift of the threshold voltage of the switching element may be reduced or prevented.

Thus, the reliability of the display apparatus may be enhanced despite extensive use or driving of the display apparatus, and the lifetime of the display apparatus may be increased.

BRIEF DESCRIPTION OF THE DRAWINGS

The above and other aspects of the present disclosure will become more apparent by describing in detailed embodiments thereof with reference to the accompanying drawings, in which.

DETAILED DESCRIPTION

Features of the inventive concept and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects and features of the present inventive concept to those skilled in the art. Accordingly, processes, elements, and techniques that are not necessary to those having ordinary skill in the art for a complete understanding of the aspects and features of the present inventive concept may not be described. Unless otherwise noted, like reference numerals denote like elements throughout the attached drawings and the written description, and thus, descriptions thereof will not be repeated. Further, parts not related to the description of the embodiments might not be shown to make the description clear. In the drawings, the relative sizes of elements, layers, and regions may be exaggerated for clarity.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When a certain embodiment may be implemented differently, a specific process order may be performed differently from the described order. For example, two consecutively described processes may be performed substantially at the same time or performed in an order opposite to the described order.

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1:
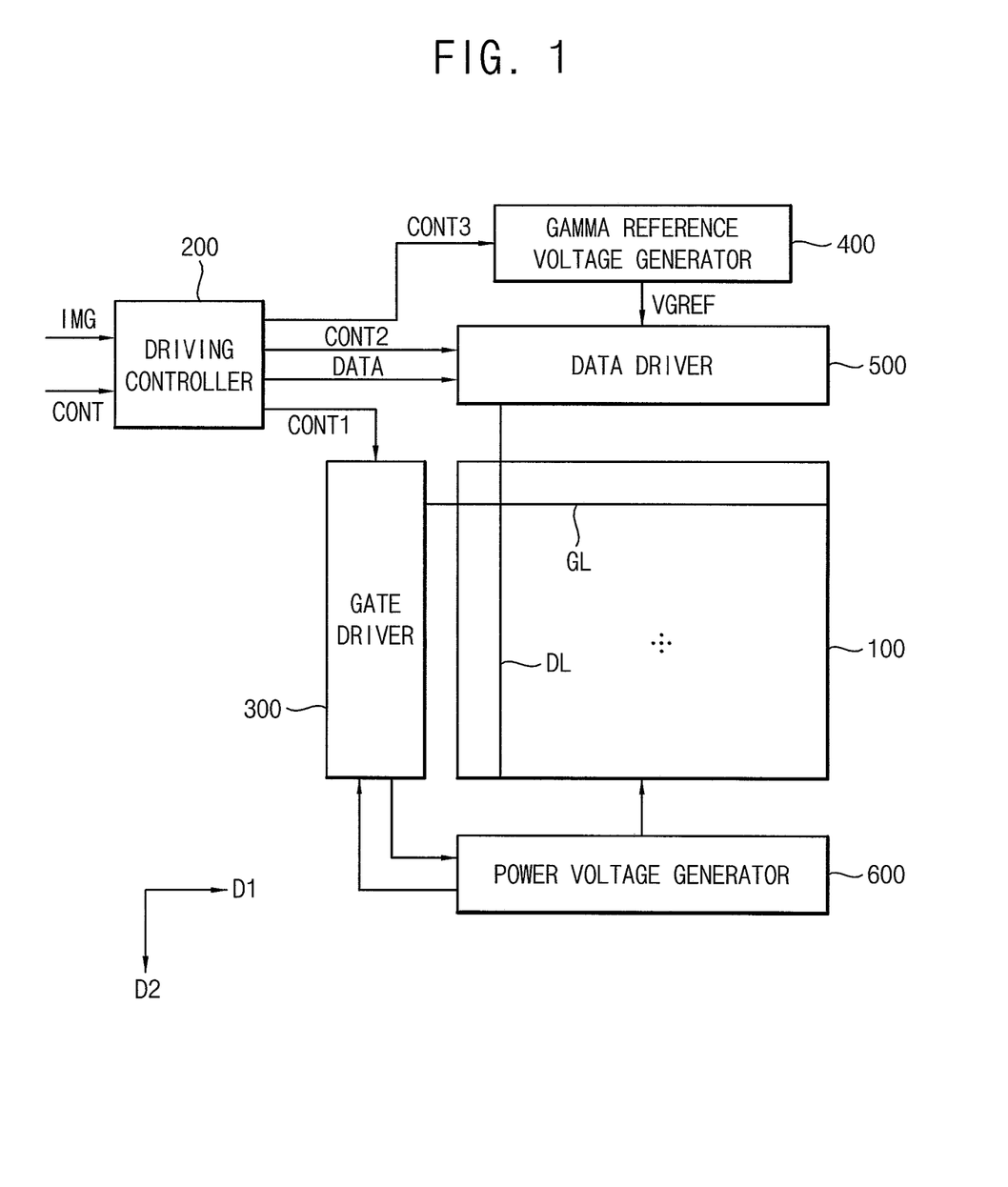
FIG. 1 is a block diagram illustrating a display apparatus according to an embodiment of the present disclosure.

FIG. 1 is a block diagram illustrating a display apparatus according to an embodiment of the present disclosure.

Referring to FIG. 1, the display apparatus includes a display panel 100 and a display panel driver. The display panel driver includes a driving controller 200, a gate driver 300, a gamma reference voltage generator 400, a data driver 500, and a power voltage generator 600.

The display panel 100 has a display region on which an image is displayed, and a peripheral region adjacent to the display region.

The display panel 100 includes a plurality of gate lines GL, a plurality of data lines DL, and a plurality of pixels respectively connected to the gate lines GL and the data lines DL. The gate lines GL extend in a first direction D1, and the data lines DL extend in a second direction D2 crossing the first direction D1.

The driving controller 200 receives input image data IMG and an input control signal CONT from an external apparatus. The input image data IMG may include red image data, green image data, and blue image data. The input image data IMG may include white image data. The input image data IMG may include magenta image data, yellow image data, and cyan image data. The input control signal CONT may include a master clock signal and a data enable signal. The input control signal CONT may include a vertical synchronizing signal and a horizontal synchronizing signal.

The driving controller 200 generates a first control signal CONT1, a second control signal CONT2, a third control signal CONT3, and a data signal DATA based on the input image data IMG and the input control signal CONT.

The driving controller 200 generates the first control signal CONT1 for controlling an operation of the gate driver 300 based on the input control signal CONT, and outputs the first control signal CONT1 to the gate driver 300. The first control signal CONT1 may include a vertical start signal and a gate clock signal.

The driving controller 200 generates the second control signal CONT2 for controlling an operation of the data driver 500 based on the input control signal CONT, and outputs the second control signal CONT2 to the data driver 500. The second control signal CONT2 may include a horizontal start signal and a load signal.

The driving controller 200 generates the data signal DATA based on the input image data IMG. The driving controller 200 outputs the data signal DATA to the data driver 500.

The driving controller 200 generates the third control signal CONT3 for controlling an operation of the gamma reference voltage generator 400 based on the input control signal CONT, and outputs the third control signal CONT3 to the gamma reference voltage generator 400.

The gate driver 300 generates gate signals for driving the gate lines GL in response to the first control signal CONT1 received from the driving controller 200. The gate driver 300 sequentially outputs the gate signals to the gate lines GL.

The gate driver 300 may be directly mounted on the display panel 100, or may be connected to the display panel 100 as a tape carrier package ("TCP") type. Alternatively, the gate driver 300 may be integrated on the display panel 100.

A structure of the gate driver 300 is explained referring to FIGS. 2 to 6 in detail.

The gamma reference voltage generator 400 generates a gamma reference voltage VGREF in response to the third control signal CONT3 received from the driving controller 200. The gamma reference voltage generator 400 provides the gamma reference voltage VGREF to the data driver 500. The gamma reference voltage VGREF has a value corresponding to a level of the data signal DATA.

In an embodiment, the gamma reference voltage generator 400 may be located in the driving controller 200, or in the data driver 500.

The data driver 500 receives the second control signal CONT2 and the data signal DATA from the driving controller 200, and receives the gamma reference voltages VGREF from the gamma reference voltage generator 400. The data driver 500 converts the data signal DATA into data voltages having an analog type by using the gamma reference voltages VGREF. The data driver 500 outputs the data voltages to the data lines DL.

The data driver 500 may be directly mounted on the display panel 100, or may be connected to the display panel 100 in a TCP type. Alternatively, the data driver 500 may be integrated on the display panel 100.

The power voltage generator 600 may generate a power voltage of the display panel 100, and may output the power voltage to the display panel 100. For example, the power voltage generator 600 may generate a common voltage, and may output the common voltage to the display panel 100.

The power voltage generator 600 may generate a power voltage of the gate driver 300, and may output the power voltage to the gate driver 300. For example, the power voltage generator 600 may generate a gate-on voltage, a first gate-off voltage and a second gate-off voltage and output the gate-on voltage, the first gate-off voltage and the second gate-off voltage to the gate driver 300.

The power voltage generator 600 may generate a power voltage of the data driver 500, and may output the power voltage to the data driver 500.

The power voltage generator 600 may generate a power voltage of the driving controller 200, and may output the power voltage to the driving controller 200.

Figure 2:
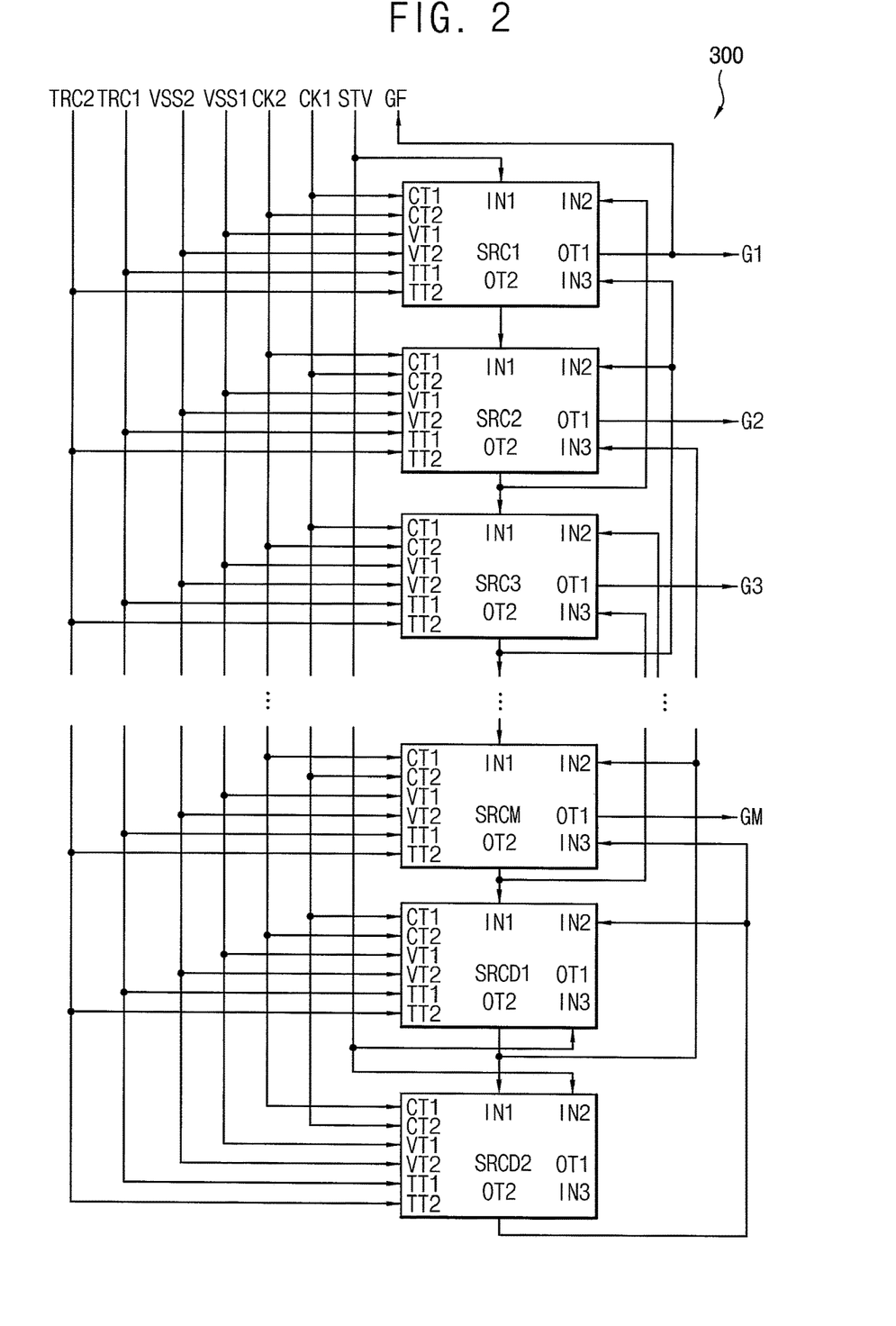
FIG. 2 is a block diagram illustrating a gate driver of FIG. 1.

FIG. 2 is a block diagram illustrating a gate driver of FIG. 1.

Referring to FIGS. 1 and 2, the gate driver 300 includes a shift register including first to M-th stages SRC1 to SRCM, a first dummy stage SRCD1 and a second dummy stage SRCD2 connected in a cascade connection.

The first to M-th stages SRC1 to SRCM are respectively connected to M gate lines, and sequentially output M gate signals to the M gate lines. The first dummy stage SRCD1 controls operation of the (M−1)-th stage SRCM-1 and the M-th stage SRCM. The second dummy stage SRCD2 controls operation of the M-th stage SRCM and the first dummy stage SRCD1. The first and second dummy stages SRCD1 and SRCD2 might not be connected to any gate lines. For example, the first to M-th stages SRC1 to SRCM, the first dummy stage SRCD1, and the second dummy stage SRCD2 may be sequentially located.

Each stage includes a first clock terminal CT1, a second clock terminal CT2, a first input terminal IN1, a second input terminal IN2, a third input terminal IN3, a first voltage terminal VT1, a second voltage terminal VT2, a first output terminal OT1, a second output terminal OT2, a first selection terminal TT1, and a second selection terminal TT2.

The first clock terminal CT1 receives a first clock signal CK1, or a second clock signal CK2 having a phase different from a phase of the first clock signal CK1. The second clock signal CK2 may have the phase inverted from the phase of the first clock signal CK1. For example, the first clock terminals CT1 of odd numbered stages SRC1, SRC3, . . . , SRCD1 receive the first clock signal CK1, and the first clock terminals CT1 of even numbered stages SRC2, SRC4, . . . , SRCD2 receive the second clock signal CK2. The first clock signal CK1 and the second clock signal CK2 have the level of a gate-on voltage, and a level of a first gate-off voltage VSS1.

The second clock terminal CT2 receives the first clock signal CK1 or the second clock signal CK2. For example, the second clock terminals CT2 of the odd numbered stages SRC1, SRC3, SRCD1 receive the second clock signal CK2, and the second clock terminals CT2 of the even numbered stages SRC2, SRC4, SRCD2 receive the first clock signal CK1.

The first input terminal IN1 receives a vertical start signal STV, or a carry signal of a previous stage. For example, the first input terminal IN1 of the first stage SRC1 receives the vertical start signal STV. The first input terminals IN1 of the second to M-th stages SRC2 to SRCM, the first dummy stage SRCD1, and the second dummy stage SRCD2 respectively receive carry signals of corresponding previous stages.

The second input terminal IN2 receives a carry signal of a next/subsequent stage or the vertical start signal STV. For example, the second input terminals IN2 of the first to M-th stages SRC1 to SRCM and the first dummy stage SRCD1 respectively receive carry signals of corresponding next stages. The second input terminal IN2 of the second dummy stage SRCD2 receives the vertical start signal STV. The vertical start signal STV inputted to the second input terminal IN2 of the second dummy stage SRCD2 may be the vertical start signal STV of a next frame.

The third input terminal IN3 receives a carry signal of a second next stage, which is a next stage of the next stage (e.g., a second next stage, or a one-after-the-next stage) or the vertical start signal STV. For example, the third input terminals IN3 of the first to M-th stages SRC1 to SRCM respectively receive carry signals of corresponding second next stages. The third input terminal IN3 of the first dummy stage SRCD1 receives the vertical start signal STV. The vertical start signal STV inputted to the third input terminal IN3 of the first dummy stage SRCD1 may be the vertical start signal STV of a next frame.

The first voltage terminal VT1 receives the first gate-off voltage VSS1. The first gate-off voltage VSS1 may have a first low level. The first low level may be a discharged level of the gate signal.

The second voltage terminal VT2 receives a second gate-off voltage VSS2 having a second low level that is lower than the first low level. The second low level may be a discharged level of a first node (e.g., Q1 in FIG. 4) of the stage.

The first output terminal OT1 is electrically connected to the corresponding gate line, and outputs the gate signal. The first output terminals OT1 of the first to M-th stages SRC1 to SRCM respectively output first to M-th gate signals. The first output terminals OT1 of the first dummy stage SRCD1 and the second dummy stage SRCD2 do not output the gate signal.

The second output terminal OT2 outputs the carry signal. The second output terminal OT2 is connected to a first input terminal IN1 of a next stage. In addition, the second output terminal OT2 is connected to a second input terminal IN2 of a previous stage and to a third input terminal IN3 of a second previous stage, which is a previous stage of the previous stage (e.g., a one-before-the-last stage).

The first selection terminal TT1 receives a first selection signal TRC1. The second selection terminal TT2 receives a second selection signal TRC2. The first selection signal TRC1 and the second selection signal TRC2 may be a signal to select a pull-up part that generates a gate signal in the stage.

In the present embodiment, at least one of gate output signals of the stages of the gate driver 300 may be fed back. Although a first gate output signal G1 is fed back in FIG. 2, the present disclosure is not limited thereto. In addition, a plurality of gate output signals of the stages of the gate driver 300 may be fed back.

Figure 3:
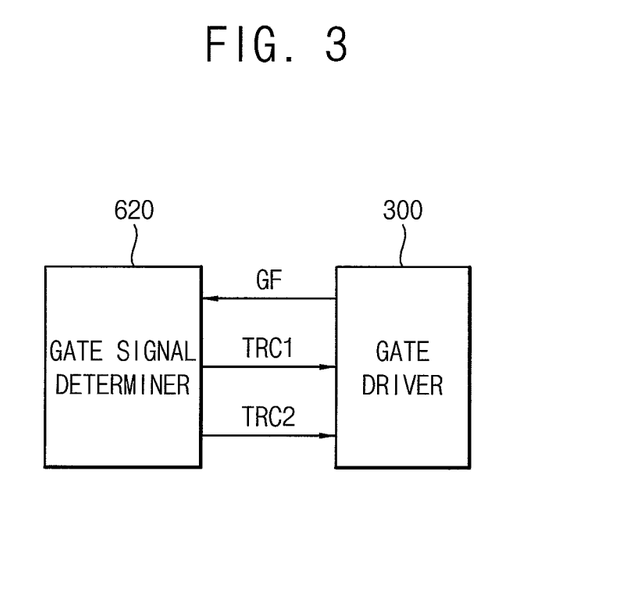
FIG. 3 is a block diagram illustrating the gate driver of FIG. 1 and a gate signal determiner of a power voltage generator of FIG. 1.

FIG. 3 is a block diagram illustrating the gate driver 300 of FIG. 1 and a gate signal determiner 620 of the power voltage generator 600 of FIG. 1.

Referring to FIGS. 1 to 3, the gate signal determiner 620 controls operation of the gate driver 300. The gate signal determiner 620 may output the selection signal TRC1 and TRC2 to the gate driver 300. The selection signal TRC1 and TRC2 may selectively activate a first pull-up part and a second pull-up part of the stage of the gate driver 300 (e.g., respectively).

The gate signal determiner 620 may be fed back the gate output signal GF from the gate driver 300. The fed back gate output signal GF may be fed back through a feedback terminal FT of the gate driver 300. When a high level of the fed back gate output signal GF is equal to or greater than a threshold reference voltage, the gate signal determiner 620 may determine that the gate driver 300 operates normally. When the high level of the fed back gate output signal GF is less than the threshold reference voltage, the gate signal determiner 620 may determine that the gate driver 300 operates abnormally.

For example, when the high level of the fed back gate output signal GF is equal to or greater than the threshold reference voltage, the gate signal determiner 620 may output the selection signal TRC1 and TRC2 to activate the first pull-up part of the gate driver 300, and to deactivate the second pull-up part of the gate driver 300.

For example, when the high level of the fed back gate output signal GF is less than the threshold reference voltage, the gate signal determiner 620 may output the selection signal TRC1 and TRC2 to deactivate the first pull-up part of the gate driver 300, and to activate the second pull-up part of the gate driver 300.

Figure 4:
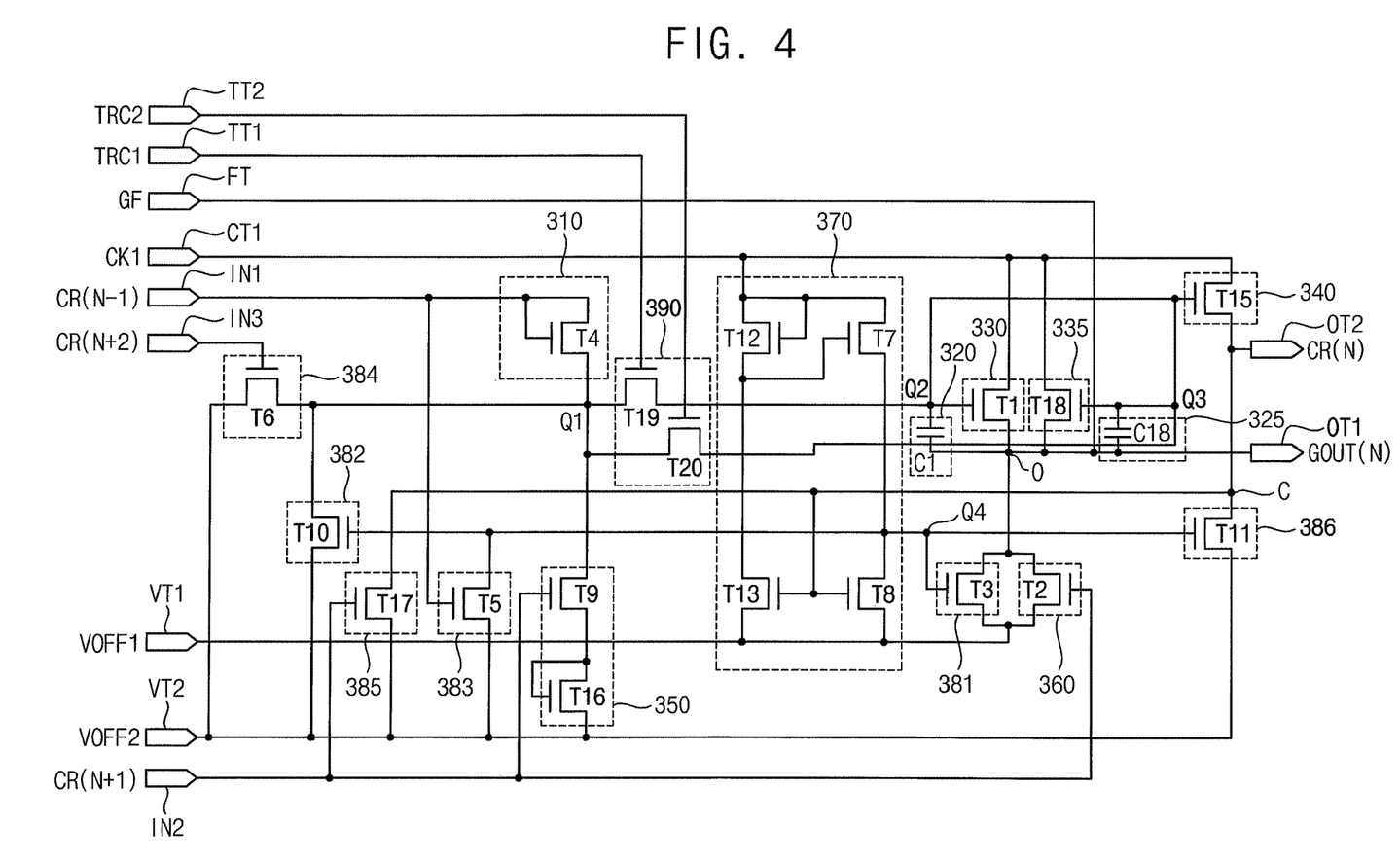
FIG. 4 is an equivalent circuit diagram illustrating an N-th stage of the gate driver of FIG. 1.
Figure 5:
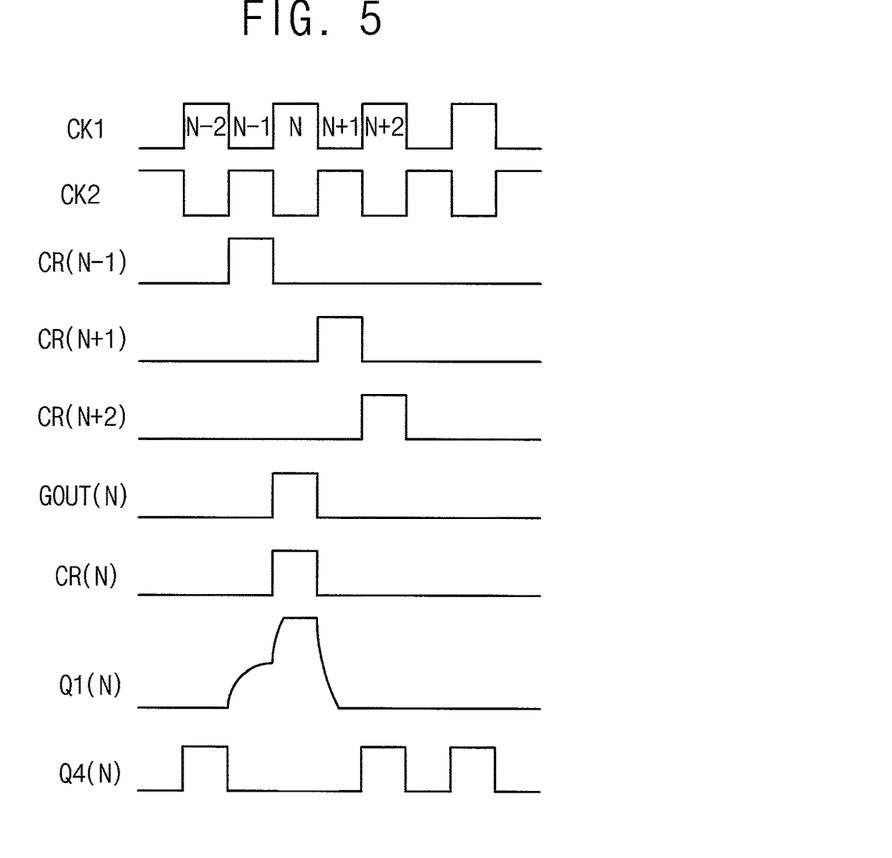
FIG. 5 is a waveform diagram illustrating input signals, node signals and output signals of the N-th stage of the gate driver of FIG. 4.

FIG. 4 is an equivalent circuit diagram illustrating an N-th stage of the gate driver 300 of FIG. 1. FIG. 5 is a waveform diagram illustrating input signals, node signals and output signals of the N-th stage of the gate driver 300 of FIG. 4.

Referring to FIGS. 1 to 5, the N-th stage according to the present embodiment includes a pull-up control part 310, a first charging part 320, a first pull-up part 330, a second charging part 325, a second pull-up part 335, a carry part 340, a first pull-down part 350, a second pull-down part 360, and an inverting part 370.

The N-th stage may further include a first holding part 381, a second holding part 382, a third holding part 383, a fourth holding part 384, a carry pull-down part 385, a fifth holding part 386, and a selecting part 390.

The pull-up control part 310 applies a first previous carry signal (e.g. CR(N−1)), which is one of carry signals of previous stages or the vertical start signal, to a first node Q1 in response to the first previous carry signal.

The pull-up control part 310 includes a fourth transistor T4. The fourth transistor T4 includes a control electrode and an input electrode commonly connected to the first input terminal IN1 for receiving the first previous carry signal (e.g. CR(N−1)) or the vertical start signal, and an output electrode connected to the first node Q1. The first node Q1 is connected to a portion of the first charging part 320 through a nineteenth transistor/first selecting transistor T19 or a portion of the second charging part 325 through a twentieth transistor/second selecting transistor T20. When the high voltage of the first previous carry signal or the vertical start signal is inputted to the pull-up control part 310, the first charging part 320 or the second charging part 325 charges a first voltage corresponding to the high voltage. The control electrode of the fourth transistor T4 may be a gate electrode. The input electrode of the fourth transistor T4 may be a source electrode. The output electrode of the fourth transistor T4 may be a drain electrode.

The first pull-up part 330 outputs the first clock signal CK1 as the N-th gate output signal GOUT(N) in response to a signal applied to the first node Q1.

The first pull-up part 330 includes a first transistor/first pull-up transistor T1. The first transistor T1 includes a control electrode connected to the first node Q1, an input electrode connected to the first clock terminal CT1 and an output electrode connected to an output node O. The control electrode of the first pull-up part 330 connected to a portion of the first charging part 320. The output node O is connected to the first output terminal OT1.

A first capacitor C1 of the first charging part 320 may be a parasitic capacitor. A first end portion of the first charging part 320 is connected to a second node Q2, and a second end portion of the first charging part 320 is connected to the output node O. For example, the control electrode of the first transistor T1 may be a gate electrode. The input electrode of the first transistor T1 may be a source electrode. The output electrode of the first transistor T1 may be a drain electrode.

As explained above, when the nineteenth transistor T19 is turned on by the first selection signal TRC1, the first node Q1 may be connected to the second node Q2.

When the first voltage charged at the first charging part 320 is applied to the control electrode of the first pull-up part 330, and the high voltage of the first clock signal CK1 is inputted to the first clock terminal CT1, the first pull-up part 330 is bootstrapped. Herein, the first node Q1 connected to the control electrode of the first pull-up part 330 is boosted from the first voltage to a boosted voltage.

When the boosted voltage is applied to the control electrode of the first pull-up part 330, the first pull-up part 330 outputs the high voltage of the first clock signal CK1 as the high voltage of the N-th gate signal GOUT(N).

The second pull-up part 335 outputs the first clock signal CK1 as the N-th gate output signal GOUT(N) in response to a signal applied to the first node Q1.

The second pull-up part 335 includes an eighteenth transistor/second pull-up transistor T18. The eighteenth transistor T18 includes a control electrode connected to a third node Q3, an input electrode connected to the first clock terminal CT1, and an output electrode connected to the output node O. The control electrode of the second pull-up part 335 connected to a portion of the second charging part 325. The output node O is connected to the first output terminal OT1.

An eighteenth capacitor C18 of the second charging part 325 may be a parasitic capacitor. A first end portion of the second charging part 325 is connected to the third node Q3, and a second end portion of the second charging part 325 is connected to the output node O. For example, the control electrode of the eighteenth transistor T18 may be a gate electrode. The input electrode of the eighteenth transistor T18 may be a source electrode. The output electrode of the eighteenth transistor T18 may be a drain electrode.

As explained above, when the twentieth transistor T20 is turned on by the second selection signal TRC2, the first node Q1 may be connected to the third node Q3.

When the first voltage is charged at the second charging part 325 is applied to the control electrode of the second pull-up part 335, and the high voltage of the first clock signal CK1 is inputted to the first clock terminal CT1, the second pull-up part 335 is bootstrapped. Herein, the first node Q1 connected to the control electrode of the second pull-up part 335 is boosted from the first voltage to a boosted voltage.

When the boosted voltage is applied to the control electrode of the second pull-up part 335, the second pull-up part 335 outputs the high voltage of the first clock signal CK1 as the high voltage of the N-th gate signal GOUT(N).

The carry part 340 outputs the first clock signal CK1 as the N-th carry signal CR(N) in response to the signal applied to the first node Q1.

The carry part 340 includes a fifteenth transistor T15. The fifteenth transistor T15 includes a control electrode connected to the first node Q1 through the nineteenth transistor T19 or the twentieth transistor T20, an input electrode connected to the first clock terminal CT1, and an output electrode connected to the second output terminal OT2. When the high voltage is applied to the first node Q1, the carry part 340 outputs the high voltage of the first clock signal CK1 inputted to the first clock terminal CT1 as the N-th carry signal CR(N). For example, the control electrode of the fifteenth transistor T15 may be a gate electrode. The input electrode of the fifteenth transistor T15 may be a source electrode. The output electrode of the fifteenth transistor T15 may be a drain electrode.

The first pull-down part 350 pulls down the voltage at the first node Q1 to the second gate-off voltage VSS2 in response to a first next carry signal (e.g. CR(N+1)), which is a carry signal of a next stage, in response to the first next carry signal.

The first pull-down part 350 may include a ninth transistor T9 and a sixteenth transistor T16. The ninth transistor T9 includes a control electrode connected to the second input terminal IN2, an input electrode connected to the first node Q1, and an output electrode connected the sixteenth transistor T16. The sixteenth transistor T16 includes a control electrode and an input electrode commonly connected to the output electrode of the ninth transistor T9, and an output electrode connected to the second voltage terminal VT2. When the first carry signal (e.g. CR(N+1)) is applied to the second input terminal IN2, the first pull-down part 350 discharges the voltage of the first node Q1 to the second gate-off voltage VSS2 applied to the second voltage terminal VT2. For example, the control electrodes of the ninth and sixteenth transistors T9 and T16 may be gate electrodes. The input electrode of the ninth and sixteenth transistors T9 and T16 may be source electrodes. The output electrode of the ninth and sixteenth transistors T9 and T16 may be drain electrodes.

The second pull-down part 360 pulls down the N-th gate output signal GOUT(N) to the first gate-off voltage VSS1 in response to the first next carry signal (e.g. CR(N+1)).

The second pull-down part 360 includes the second transistor T2. The second transistor T2 includes a control electrode connected to the second input terminal IN2, an input electrode connected to the output node O, and an output electrode connected to the first voltage terminal VT1. When the first carry signal (e.g. CR(N+1)) is applied to the second input terminal IN2, the second pull-down part 360 discharges the voltage of the output node O to the first gate-off voltage VSS1 applied to the first voltage terminal VT1. For example, the control electrode of the second transistor T2 may be a gate electrode. The input electrode of the second transistor T2 may be a source electrode. The output electrode of the second transistor T2 may be a drain electrode.

The inverting part 370 generates an inverting signal based on the first clock signal CK1 and the first gate-off voltage VSS1 to output the inverting signal to a fourth node Q4. The fourth node Q4 is called to an inverting node. Alternatively, the inverting part 370 may generate the inverting signal based on the first clock signal CK1 and the second gate-off voltage VSS2 to output the inverting signal to the fourth node Q4.

The inverting part 370 includes a twelfth transistor T12, a seventh transistor T7, a thirteenth transistor T13, and an eighth transistor T8. The twelfth transistor T12 includes a control electrode and an input electrode commonly connected to the first clock terminal CT1, and an output electrode connected to an input electrode of the thirteenth transistor T13 and to a control electrode of the seventh transistor T7.

The seventh transistor T7 includes the control electrode connected to the output electrode of the twelfth transistor T12, an input electrode connected to the first clock terminal CT1, and an output electrode connected to an input electrode of the eighth transistor T8. The output electrode of the seventh transistor T7 is connected to the fourth node Q4.

The thirteenth transistor T13 includes a control electrode connected to a C node, an input electrode connected to the output electrode of the twelfth transistor T12, and an output electrode connected to the first voltage terminal VT1.

The eighth transistor T8 includes a control electrode connected to the C node, an input electrode connected to the fourth node Q4, and an output electrode connected to the first voltage terminal VT1.

For example, the control electrodes of the twelfth, seventh, thirteenth and eighth transistors T12, T7, T13 and T8 may be gate electrodes. The input electrode of the twelfth, seventh, thirteenth and eighth transistors T12, T7, T13 and T8 may be source electrodes. The output electrode of the twelfth, seventh, thirteenth and eighth transistors T12, T7, T13 and T8 may be drain electrodes.

The carry pull-down part 385 pulls down the N-th carry signal CR(N) to the second gate-off voltage VSS2 in response to the first next carry signal (e.g. CR(N+1)). The carry pull-down part 385 includes a seventeenth transistor T17. The seventeenth transistor T17 includes a control electrode connected to the second input terminal IN2, an input electrode connected to the C node, and an output electrode connected to the second voltage terminal VT2. For example, the control electrode of the seventeenth transistor T17 may be a gate electrode. The input electrode of the seventeenth transistor T17 may be a source electrode. The output electrode of the seventeenth transistor T17 may be a drain electrode.

The first holding part 381 includes a third transistor T3. The third transistor T3 includes a control electrode connected to the fourth node Q4, an input electrode connected to the output node O, and an output electrode connected to the first voltage terminal VT1. The first holding part 381 maintains the voltage of the output node O in the first gate-off voltage VSS1 in response to the signal at the fourth node Q4 during a gate output off duration. For example, the control electrode of the third transistor T3 may be a gate electrode. The input electrode of the third transistor T3 may be a source electrode. The output electrode of the third transistor T3 may be a drain electrode.

The second holding part 382 may include a tenth transistor T10. The tenth transistor T10 includes a control electrode connected to the fourth node Q4, an input electrode connected to the first node Q1, and an output electrode connected to the second voltage terminal VT2. For example, the control electrode of the tenth transistor T10 may be a gate electrode. The input electrode of the tenth transistor T10 may be a source electrode. The output electrode of the tenth transistor T10 may be a drain electrode.

The third holding part 383 includes a fifth transistor T5. The fifth transistor T5 includes a control electrode connected to the first input terminal IN1, an input electrode connected to the fourth node Q4, and an output electrode connected to the second voltage terminal VT2. The control electrode, the input electrode, and the output electrode of the fifth transistor T5 may be a gate electrode, a source electrode and a drain electrode, respectively.

The fourth holding part 384 includes a sixth transistor T6. The sixth transistor T6 includes a control electrode connected to the third input terminal IN3 for receiving a second next carry signal (e.g. CR(N+2), which may be a carry signal from a stage after next), an input electrode connected to the first node Q1 and an output electrode connected to the second voltage terminal VT2. The control electrode, the input electrode and the output electrode of the sixth transistor T6 may be a gate electrode, a source electrode and a drain electrode, respectively.

The fifth holding part 386 includes an eleventh transistor T11. The eleventh transistor T11 includes a control electrode connected to the fourth node Q4, an input electrode connected to the C node, and an output electrode connected to the second voltage terminal VT2. The control electrode, the input electrode, and the output electrode of the eleventh transistor T11 may be a gate electrode, a source electrode, and a drain electrode, respectively.

The selecting part 390 may include a first selecting transistor/the nineteenth transistor T19 and a second selecting transistor/the twentieth transistor T20.

The first selecting transistor T19 includes a control electrode to which the first selection signal TRC1 is applied, an input electrode connected to the first node Q1, and an output electrode connected to the second node Q2.

The second selecting transistor T20 includes a control electrode to which the second selection signal TRC2 is applied, an input electrode connected to the first node Q1, and an output electrode connected to the third node Q3.

Although the N-th stage includes only the first clock terminal CT1 and receives only the first clock signal CK1 in the present exemplary embodiment, the N-th stage may include the first clock terminal CT1 and the second clock terminal CT2 and may receive the first clock signal CK1 and the second clock signal CK2 in an exemplary embodiment.

Figure 6:
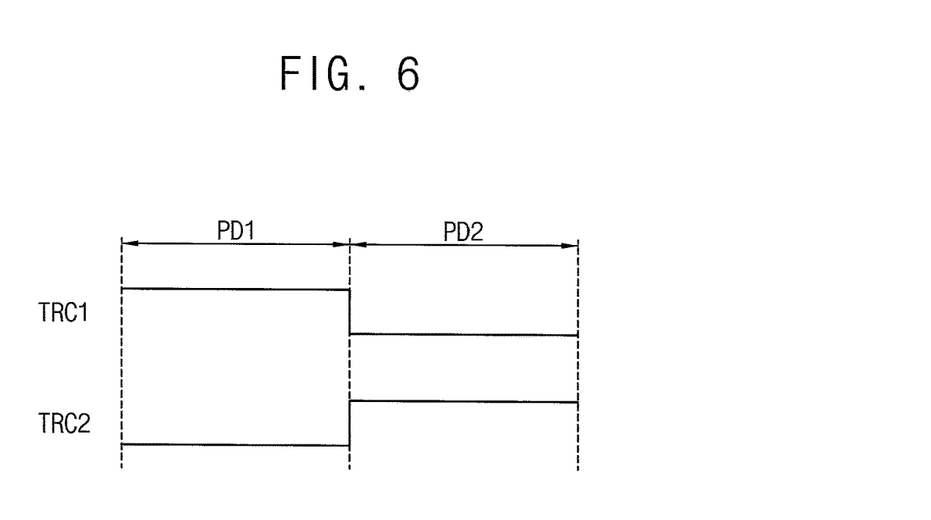
FIG. 6 is a waveform diagram illustrating an output signal of the gate signal determiner of FIG. 3.

FIG. 6 is a waveform diagram illustrating an output signal TRC1 and TRC2 of the gate signal determiner 620 of FIG. 3.

Referring to FIGS. 1 to 6, the gate signal determiner 620 receives the fed back gate output signal GF from at least one stage of the gate driver 300.

When the high level of the fed back gate output signal GF is equal to or greater than the threshold reference voltage, the gate signal determiner 620 may determine that the first pull-up part 330 of the gate driver 300 operates normally. Thus, during a time duration PD1, when the high level of the fed back gate output signal GF is equal to or greater than the threshold reference voltage, the gate signal determiner 620 outputs the first selection signal TRC1 having an activation level and the second selection signal TRC2 having a deactivation level to the gate driver 300.

Accordingly, in response to the first and second selection signals TRC1 and TRC2 (e.g., during the time duration PD1), the nineteenth transistor T19 is turned on and the twentieth transistor T20 is turned off so that the gate driver 300 outputs the gate output signal using the first pull-up part 330.

When the high level of the fed back gate output signal GF is less than the threshold reference voltage, the gate signal determiner 620 may determine that the first pull-up part 330 of the gate driver 300 operates abnormally. Thus, during a time duration PD2, when the high level of the fed back gate output signal GF is less than the threshold reference voltage, the gate signal determiner 620 outputs the first selection signal TRC1 having an deactivation level and the second selection signal TRC2 having an activation level to the gate driver 300.

Accordingly, in response to the first and second selection signals TRC1 and TRC2 (e.g., during the period PD2), the nineteenth transistor T19 is turned off and the twentieth transistor T20 is turned on so that the gate driver 300 outputs the gate output signal using the second pull-up part 335.

When the high level of the fed back gate output signal GF is less than the threshold reference voltage, the first pull-up part 330 of the gate drive 300 may not be normally operated. Thus, the gate driver 300 may output the gate output signal using the second pull-up part 335 by control of the gate signal determiner 620.

In the present embodiment, the gate signal determiner 620 may receive the fed back gate output signal GF from one of the stages and the gate signal determiner 620, and may control operations of the first pull-up part 330 and the second pull-up part 335 of all stages. Alternatively, the gate signal determiner 620 may receive the plurality of fed back gate output signals GF from the plurality of the stages to accurately determine the status of the gate driver 300. In addition, although the operations of the first pull-up part 330 and the second pull-up part 335 of all stages may be controlled in the same way in the present embodiment, the gate signal determiner 620 may independently control the operations of the first pull-up part 330 and the second pull-up part 335 of the stages.

In the present embodiment, the power voltage generator 600 may include the gate signal determiner 620.

According to the present embodiment, when the display apparatus is driven for a long time, a shift of the threshold voltage of the switching element (e.g. the first transistor T1) of the gate driver 300 may be reduced or prevented so that the display defect in which the gate driver 300 does not output a normal gate signal due to the shift of the threshold voltage of the switching element may be reduced or prevented. When the first pull-up part 330 operates abnormally, the gate driver 300 may output the gate output voltage using the second pull-up part 335 instead of the first pull-up part 330, so that the reliability of the gate driver 300 may be enhanced and the lifetime of the display apparatus may be increased.

Figure 7:
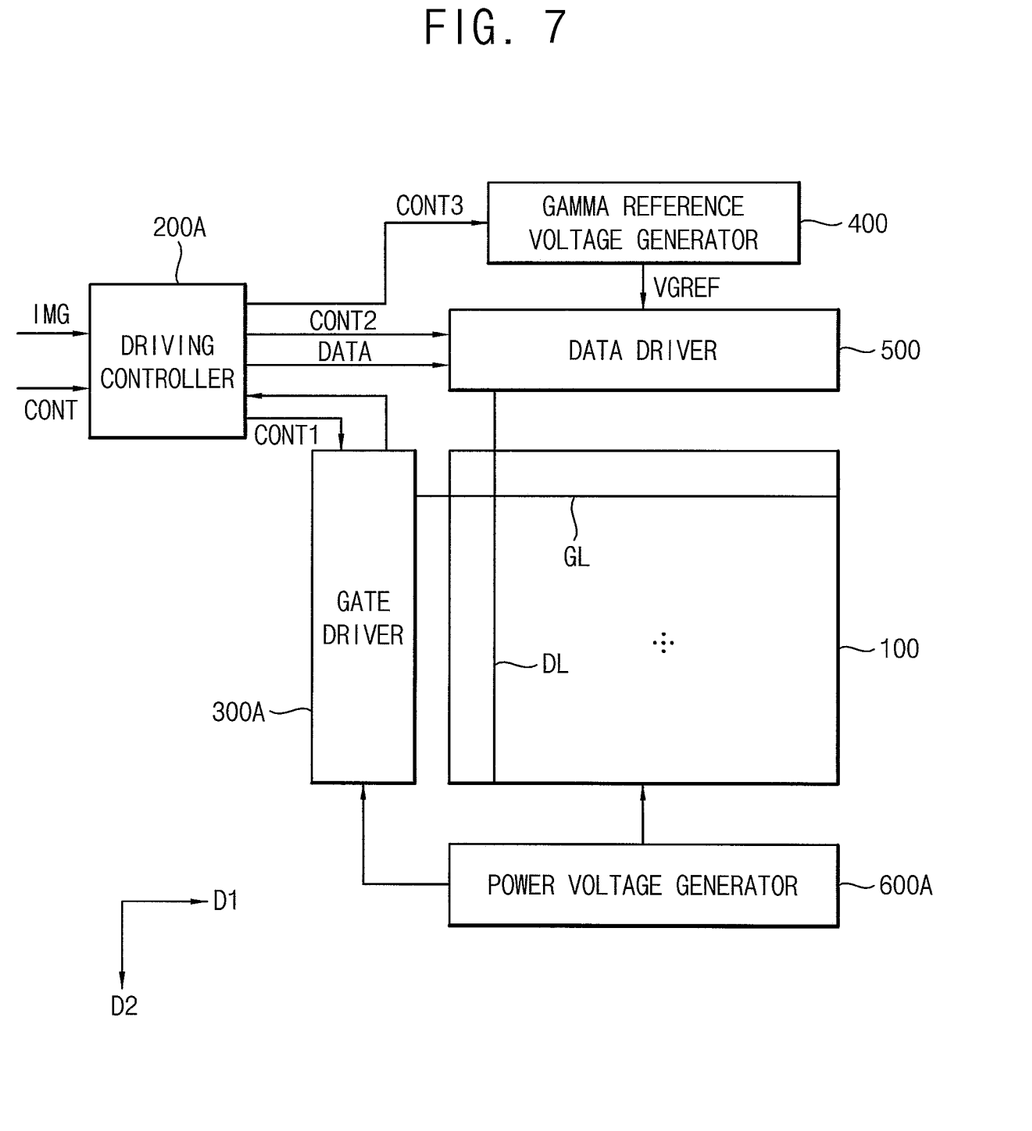
FIG. 7 is a block diagram illustrating a display apparatus according to an embodiment of the present disclosure.
Figure 8:
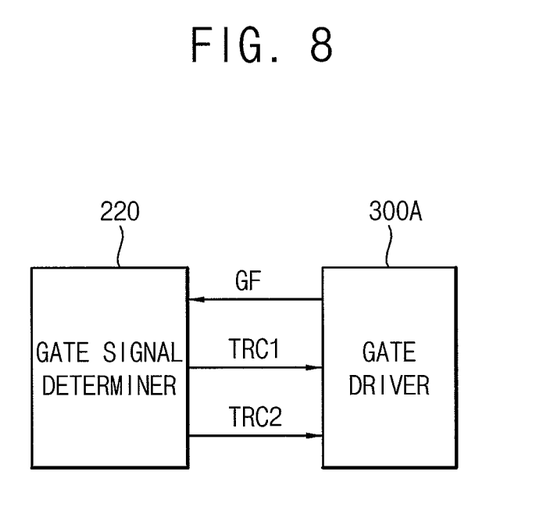
FIG. 8 is a block diagram illustrating a gate driver of FIG. 7 and a gate signal determiner of a driving controller of FIG. 7.

FIG. 7 is a block diagram illustrating a display apparatus according to an embodiment of the present disclosure. FIG. 8 is a block diagram illustrating a gate driver 300A of FIG. 7 and a gate signal determiner 220 of a driving controller 200A of FIG. 7.

The display apparatus according to the present embodiment is substantially the same as the display apparatus of the previous embodiment explained referring to FIGS. 1 to 6, except that the driving controller includes the gate signal determiner. Thus, the same reference numerals will be used to refer to the same or like parts as those described in the previous embodiment of FIGS. 1 to 6, and any repetitive explanation concerning the above elements will be omitted.

Referring to FIGS. 2, 4, 6, 7 and 8, the display apparatus includes a display panel 100 and a display panel driver. The display panel driver includes a driving controller 200A, a gate driver 300A, a gamma reference voltage generator 400, a data driver 500, and a power voltage generator 600A.

In the present embodiment, the driving controller 200A may include the gate signal determiner 220.

The gate signal determiner 220 controls operation of the gate driver 300A. The gate signal determiner 220 may output the selection signal TRC1 and TRC2 to the gate driver 300A. The selection signal TRC1 and TRC2 may selectively activate a first pull-up part and a second pull-up part of the stage of the gate driver 300A.

When the high level of the fed back gate output signal GF is equal to or greater than the threshold reference voltage, the gate signal determiner 220 may determine that the first pull-up part 330 of the gate driver 300A operates normally. Thus, during a time duration PD1, when the high level of the fed back gate output signal GF is equal to or greater than the threshold reference voltage, the gate signal determiner 220 outputs the first selection signal TRC1 having an activation level and the second selection signal TRC2 having a deactivation level to the gate driver 300A. Accordingly, in response to these respective first and second selection signals TRC1 and TRC2, the nineteenth transistor T19 is turned on and the twentieth transistor T20 is turned off so that the gate driver 300A outputs the gate output signal using the first pull-up part 330.

When the high level of the fed back gate output signal GF is less than the threshold reference voltage, the gate signal determiner 220 may determine that the first pull-up part 330 of the gate driver 300A operates abnormally. Thus, during a time duration PD2, when the high level of the fed back gate output signal GF is less than the threshold reference voltage, the gate signal determiner 220 outputs the first selection signal TRC1 having an deactivation level and the second selection signal TRC2 having an activation level to the gate driver 300A. Accordingly, in response to these respective first and second selection signals TRC1 and TRC2, the nineteenth transistor T19 is turned off and the twentieth transistor T20 is turned on so that the gate driver 300A outputs the gate output signal using the second pull-up part 335.

According to the present embodiment, when the display apparatus is driven for a long time, a shift of the threshold voltage of the switching element (e.g. the first transistor T1) of the gate driver 300A may be reduced or prevented so that the display defect which the gate driver 300A does not output a normal gate signal due to the shift of the threshold voltage of the switching element may be prevented. When the first pull-up part 330 operates abnormally, the gate driver 300A may output the gate output voltage using the second pull-up part 335 instead of the first pull-up part 330 so that the reliability of the gate driver 300A may be enhanced, and the lifetime of the display apparatus may be increased.

According to the present disclosure, as explained above, the reliability of the display apparatus may be enhanced and the lifetime of the display apparatus may be increased.

The foregoing is illustrative of the present disclosure and is not to be construed as limiting thereof. Although a few embodiments of the present disclosure have been described, those skilled in the art will readily appreciate that many modifications are possible in the embodiments without materially departing from the novel teachings and advantages of the present disclosure. Accordingly, all such modifications are intended to be included within the scope of the present disclosure as defined in the claims. In the claims, means-plus-function clauses are intended to cover the structures described herein as performing the recited function and not only structural equivalents but also equivalent structures. Therefore, it is to be understood that the foregoing is illustrative of the present disclosure and is not to be construed as limited to the specific embodiments disclosed, and that modifications to the disclosed embodiments, as well as other embodiments, are intended to be included within the scope of the appended claims. The present disclosure is defined by the following claims, with equivalents of the claims to be included therein.

What is claimed is:

1. A gate driving circuit comprising:
a pull-up control part configured to apply a first previous carry signal, which is a carry signal of one of previous stages, to a first node in response to the first previous carry signal;
a first pull-up part configured to output a clock signal as an N-th gate output signal in response to a signal applied to the first node;
a second pull-up part configured to output the clock signal as the N-th gate output signal in response to the signal applied to the first node;

a carry part configured to output the clock signal as an N-th carry signal in response to the signal applied to the first node;
a first pull-down part configured to pull down the signal at the first node to a second gate-off voltage in response to a first next carry signal, which is a carry signal of one of next stages;
a second pull-down part configured to pull down the N-th gate output signal to a first gate-off voltage in response to the first next carry signal; and
an inverting part configured to generate an inverting signal based on the clock signal, and based on the first gate-off voltage or the second gate-off voltage, to output the inverting signal to an inverting node,
wherein one of the first pull-up part and the second pull-up part is selectively activated, and
wherein N is a positive integer.

2. The gate driving circuit of claim 1, wherein the gate driving circuit comprises a plurality of stages, and
wherein a gate output voltage of at least one of the stages is fed back.

3. The gate driving circuit of claim 1, wherein the first pull-up part comprises a first pull-up transistor comprising a control electrode coupled to a second node, an input electrode for receiving the clock signal, and an output electrode coupled to a gate output terminal configured to output the N-th gate output signal.

4. The gate driving circuit of claim 3, wherein the second pull-up part comprises a second pull-up transistor comprising a control electrode coupled to a third node, an input electrode for receiving the clock signal, and an output electrode coupled to the gate output terminal configured to output the N-th gate output signal.

5. The gate driving circuit of claim 4, further comprising a first selecting transistor comprising a control electrode for receiving a first selecting signal, an input electrode coupled to the first node, and an output electrode coupled to the second node.

6. The gate driving circuit of claim 5, further comprising a second selecting transistor comprising a control electrode for receiving a second selecting signal, an input electrode coupled to the first node, and an output electrode coupled to the third node.

7. The gate driving circuit of claim 1, further comprising a carry pull-down part configured to pull down the N-th carry signal to the second gate-off voltage in response to the first next carry signal.

8. The gate driving circuit of claim 7, further comprising a first holding part configured to pull down the N-th gate output signal to the first gate-off voltage in response to the inverting signal.

9. The gate driving circuit of claim 8, further comprising a second holding part configured to pull down the first node to the second gate-off voltage in response to the inverting signal.

10. The gate driving circuit of claim 9, further comprising a third holding part configured to pull down the inverting node to the second gate-off voltage in response to the first previous carry signal.

11. The gate driving circuit of claim 10, further comprising a fourth holding part configured to pull down the first node to the second gate-off voltage in response to a second next carry signal, which is a carry signal of one of the next stages and is different from the first next carry signal.

12. The gate driving circuit of claim 11, further comprising a fifth holding part configured to pull down the N-th carry signal to the second gate-off voltage in response to the inverting signal.

13. A display apparatus comprising:
a display panel configured to display an image;
a data driving circuit configured to output a data voltage to the display panel;
a gate driving circuit configured to output a gate output signal to the display panel; and
a gate signal determiner configured to control operation of the gate driving circuit,
wherein the gate driving circuit comprises:
a pull-up control part configured to apply a first previous carry signal, which is a carry signal of one of previous stages, to a first node in response to the first previous carry signal;
a first pull-up part configured to output a clock signal as an N-th gate output signal in response to a signal applied to the first node;
a second pull-up part configured to output the clock signal as the N-th gate output signal in response to the signal applied to the first node;
a carry part configured to output the clock signal as an N-th carry signal in response to the signal applied to the first node;
a first pull-down part configured to pull down the signal at the first node to a second gate-off voltage in response to a first next carry signal, which is a carry signal of one of next stages;
a second pull-down part configured to pull down the N-th gate output signal to a first gate-off voltage in response to the first next carry signal; and
an inverting part configured to generate an inverting signal based on the clock signal, and based on the first gate-off voltage or the second gate-off voltage, to output the inverting signal to an inverting node,
wherein the gate signal determiner is configured to output a selecting signal, which is for activating one of the first pull-up part and the second pull-up part, to the gate driving circuit, and
wherein N is a positive integer.

14. The display apparatus of claim 13, further comprising a power voltage generator configured to output a driving voltage to the gate driving circuit, and comprising the gate signal determiner.

15. The display apparatus of claim 13, further comprising a driving controller configured to control driving timings of the data driving circuit and the gate driving circuit, and comprising the gate signal determiner.

16. The display apparatus of claim 13, wherein the gate driving circuit comprises a plurality of stages, and
wherein a gate output voltage of at least one of the stages is fed back to the gate signal determiner.

17. The display apparatus of claim 13, wherein the first pull-up part comprises a first pull-up transistor comprising a control electrode coupled to a second node, an input electrode for receiving the clock signal, and an output electrode coupled to a gate output terminal configured to output the N-th gate output signal.

18. The display apparatus of claim 17, wherein the second pull-up part comprises a second pull-up transistor comprising a control electrode coupled to a third node, an input electrode for receiving the clock signal, and an output electrode coupled to the gate output terminal configured to output the N-th gate output signal.

19. The display apparatus of claim 18, wherein the gate driving circuit further comprises a first selecting transistor comprising a control electrode for receiving a first selecting signal, an input electrode coupled to the first node, and an output electrode coupled to the second node.

20. The display apparatus of claim 19, wherein the gate driving circuit further comprises a second selecting transistor comprising a control electrode for receiving a second selecting signal, an input electrode coupled to the first node, and an output electrode coupled to the third node.

* * * * *